United States Patent [19]

Ferrieu et al.

[11] 4,386,236

[45] May 31, 1983

[54] AUTOMATIC SOUND LEVEL CONTROL OF TELEPHONE STATION

[75] Inventors: Gilbert M. M. Ferrieu, Bievres; Emmanuel Lefort, Montigny le Bretonneux; Françoise Molière, Paris, all of France

[73] Assignee: Televommunications Radioelectriques et Telephoniques T.R.T., Paris, France

[21] Appl. No.: 244,359

[22] Filed: Mar. 16, 1981

[30] Foreign Application Priority Data

Mar. 28, 1980 [FR] France .............................. 80 07055

[51] Int. Cl.³ ............................................ H04M 1/60
[52] U.S. Cl. .................................. 179/1 VL; 179/1 F
[58] Field of Search .................... 179/1 VL, 1 P, 1 F; 330/279; 332/11 D

[56] References Cited

U.S. PATENT DOCUMENTS 3,911,363  10/1975  Patten ........................... 332/11 D X Primary Examiner—G. Z. Rubinson
Assistant Examiner—James L. Dwyer
Attorney, Agent, or Firm—Thomas A. Briody; William J. Streeter; Laurence A. Wright

[57] ABSTRACT

This arrangement comprises a controllable attenuation circuit of the voice signal received, a pulse-duration modulator which produces pulses the duration of which is modulated by the voice signal supplied by the controllable attenuation circuit, an overshoot detection circuit which produces from the modulated pulses a compression pulse each time it is detected that the amplitude of the modulated voice signal reaches a certain threshold, the compression signal produced by the said overshoot detection circuit being applied in the attenuation circuit to an integrating circuit which produces the attenuation control signal. The amplifier of the loudspeaker receives the modulated signal.

5 Claims, 7 Drawing Figures

AUTOMATIC SOUND LEVEL CONTROL OF A TELEPHONE STATION

The invention relates to an arrangement for the automatic control of the sound level of a telephone station, comprising a controllable attenuation circuit for the voice signal received.

BACKGROUND OF THE INVENTION

Such a control arrangement may be used in, for example, telephone stations having a loudspeaker and be arranged before the amplifier which feeds the loudspeaker. Whatever the level of the signal received in the control range, this control arrangement enables the amplifier to operate with a constant signal level at its input and to ensure a constant sound level, which is selected by the user by adjusting the gain of the amplifier.

The properties which such a control arrangement must satisfy are, particularly, a simple construction, low cost and the possibility of integration. In addition, this control arrangement must produce a signal which can be amplified in a simple way and with little cost in a loudspeaker amplifier which must also be integrable.

The known control arrangements are circuits denoted AGC (automatic gain control) in which the level of the voice signal received is detected for controlling an attenuation circuit of this received signal. A circuit of this type is used in, for example, the telephone station described in the article "Model S-1P Loudspeaker Telephone Circuit Design" by K. Kato et al., published in the periodical "Review of the Electrical Communication Laboratories", Volume 27, Nos. 5–6, May–June 1979, pages 347–367. In the solution proposed therein the signal which is applied to the loudspeaker amplifier has the shape of the voice signal, which makes this amplifier comparatively expensive to produce and it has a mediocre efficiency, which is not favourable for its integration.

SUMMARY OF THE INVENTION

The present invention furnishes a control arrangement which is completely different from the known arrangement, is of a simple implementation and may be associated with a loudspeaker amplifier of an equally simple implementation and having an increased efficiency.

According to the invention, an arrangement for the control of the sound level of a telephone station is characterized in that it comprises a pulse-duration modulator producing a signal which is formed by pulses the duration of which has been modulated by the voice signal supplied by the controllable attenuation circuit, an overshoot detector which produces from the signal supplied by the modulator a compression pulse each time it is detected that the amplitude of the modulating speech signal reaches a certain threshold, the said compression pulses being applied to the said attenuation circuit to control charging of an integrating circuit which produces the attenuation control signal.

BRIEF DESCRIPTION OF THE DRAWINGS

Embodiments of the invention will now be described by way of example with reference to the accompanying drawing wherein.

DETAILED DESCRIPTION OF THE PREFERRED EMBODIMENTS

Figure 1:
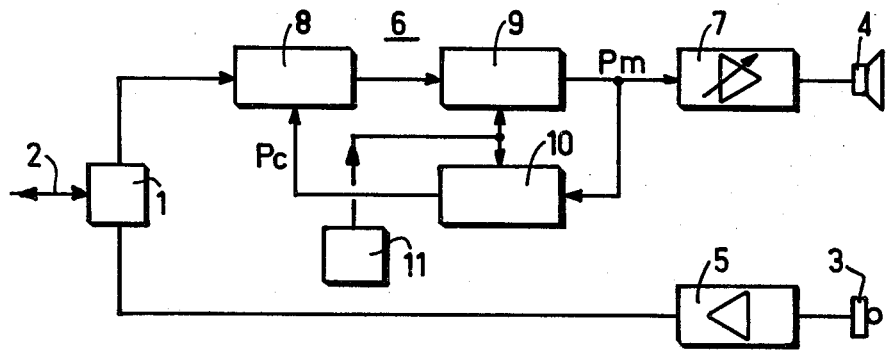
FIG. 1 is a schematic circuit diagram of the control arrangement according to the invention, incorporated in a telephone station.

In FIG. 1 which shows the schematic diagram of a telephone station comprising the control arrangement of the invention, the coupling circuit 1, which is alternatively denoted hybrid circuit, couples the telephone line 2 to the transmission path of the station which comprises the microphone 3 and the receiving path of the station which comprises the loudspeaker 4. The transmission path comprises a microphone amplifier 5 and the receiving path comprises, arranged between the hybride junction and the loudspeaker, an automatic level control circuit 6, which applies to the loudspeaker amplifier 7 a signal which is representative of the voice signal which is controlled with a fixed level. The amplifier 7 has a controllable gain which is adjusted by the user to obtain a sound level which he considers pleasant, independent of the level of the received signal thanks to the level control circuit 6.

The level control circuits which are generally used in telephone stations are AGC circuits in which a level detector, not shown, of the received signal is used to control a controllable attenuation circuit 8. The controlled-level voice signal supplied by the attenuation circuit is applied directly to the loudspeaker amplifier 7.

The present invention furnishes a level control arrangement of a different design, which is simple to realize and to integrate and by means of which a considerably simpler loudspeaker amplifier can be realized and which has a better efficiency than a conventional voice signal amplifier.

In the greatly simplified form shown in FIG. 1, the level control circuit of the invention comprises a pulse-duration modulator 9, which receives the attenuated voice signals supplied by the controllable attenuation circuit 8. As described hereafter, this modulator 9 produces a pulse signal $P_m$ in which the duration of the pulses is modulated by a signal formed from the sum of a constant direct current and the voice signal. The modulated signal $P_m$ is applied to an overshoot detection circuit 10 which produces a compression pulse each time it detects that the amplitude of the modulation voice signal reaches a predetermined threshold. The compression signal $P_c$ formed thus is applied to the variable attenuation circuit 8, which comprises an integrating circuit which is charged during the compression pulses and which produces the attenuation control signal. Finally, the control circuit 11 generates different control signals which are necessary for a proper operation of the circuits 9 and 10 of the level control circuit.

The pulse signal $P_m$ formed from the duration-modulated pulses is amplified in the amplifier 7 by means of a level control circuit of the above-described construction. This type of amplifier for signals formed from duration-modulated pulses is often denoted class-D amplifier. It is known as an amplifier having an excellent efficiency. The signal $P_m$ amplified thus may be applied directly to the loudspeaker 4, which acts as a filter suppressing the high-frequency components.

Figure 2:
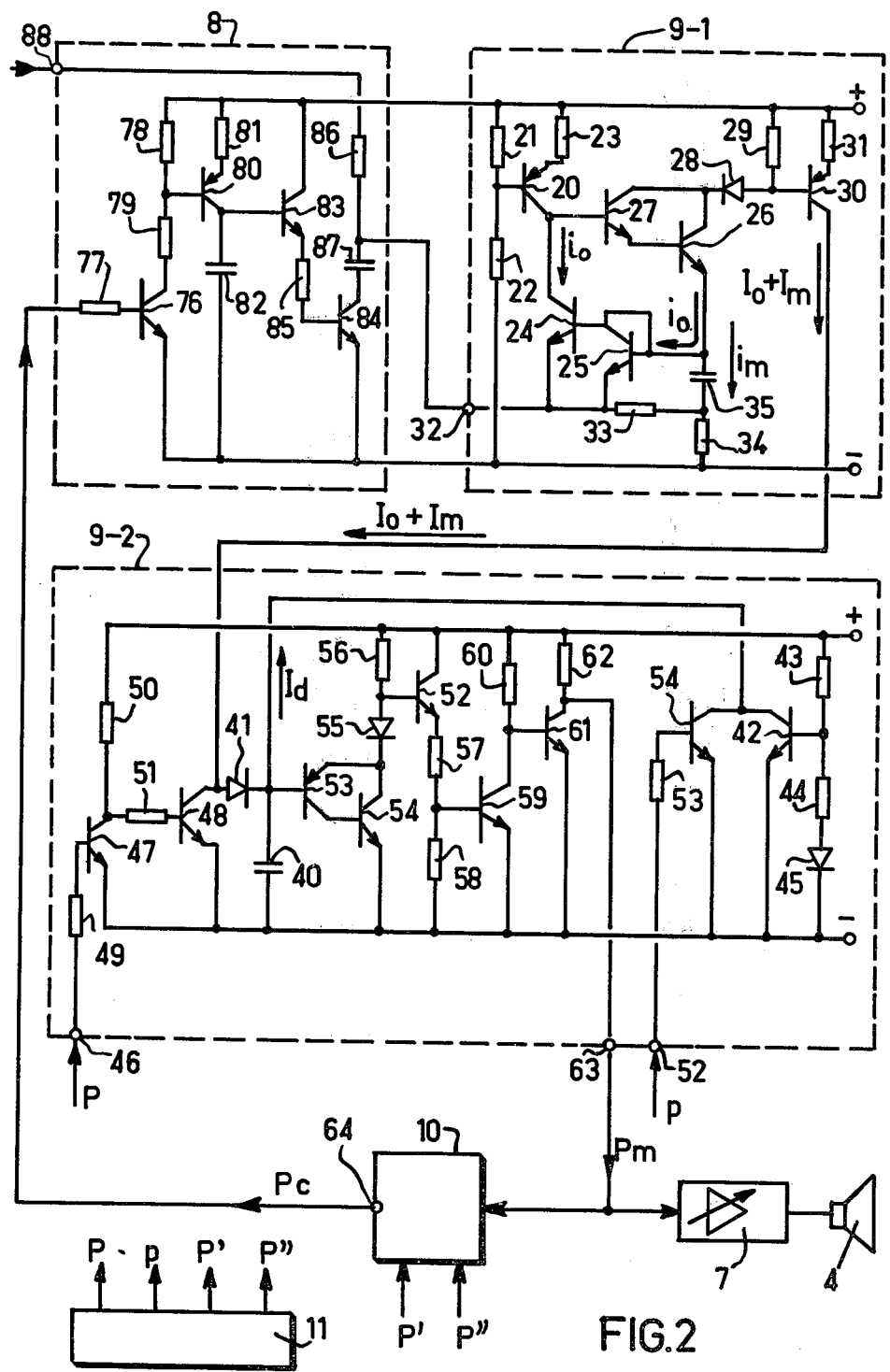
FIG. 2 is a detailed circuit diagram of the control arrangement of the invention.

FIG. 2 shows an embodiment of the circuits 8 and 9 forming, in conjunction with circuit 10, the level control arrangement of the invention. Elements corresponding to elements of the FIGS. 1 and 2 have been given the same reference numerals. All the circuits are supplied from a d.c. voltage source whose positive and negative terminals are denoted by + and −, respectively.

For simplicity of the description the pulse-duration modulator 9 will now be described first. This modulator 9 comprises a first portion 9-1 in which the sum current $I_o+I_m$ is processed, $I_o$ being a direct current of constant amplitude and $I_m$ being a current corresponding to the received voice signal and attenuated by the controllable attenuation circuit 8. Duration-modulated pulses are formed in the second portion 9-2 of the modulator by the sum signal $I_o+I_m$, these pulses forming the modulated signal $P_m$.

The first portion 9-1 of the modulator comprises a pnp transistor 20 the base of which is polarised by the resistance bridge 21 and 22, which comprises an emitter resistor 23 and which injects a fixed direct current $i_o$ into the input of a current mirror formed by npn transistors 24 and 25, which are connected as shown in the Figure. When this current mirror has been designed to obtain a current ratio of 1 (transistors 24 and 25 identical), the direct current $i_o$ appears at the output of current mirror 24, 25, this output being formed by the bases of the transistors 25 and 24 which are connected to the collector of the transistor 25. This direct current $i_o$ flows through the emitter-collector space of the conducting npn transistor 26, diode 28 and resistor 29. It should be noted that transistor 26 is connected with npn transistor 27 as a Darlington circuit to form a composite transistor which can be driven by a very weak current, which is the base current of transistor 27, obtained from the collector current of transistor 20. The d.c. voltage at the terminals of resistor 29, obtained from the direct current $i_o$, determines a direct current $I_o$ in the collector of pnp transistor 30. The value of this direct current $I_o$ can be adjusted by the ratio between resistor 29 and resistor 31 in the emitter of the transistor 30.

In addition, there is applied between input terminal 32 of modulator 9 and the negative supply terminal a variable voltage which corresponds to the voice signal and has been processed in controllable attenuation circuit 8, as will be explained hereafter. The terminal 32 is connected to emitters of the transistors 24 and 25, which form a current mirror, and to one end of the resistance bridge 33 and 34, the other end of which is connected to the negative supply terminal. The variable voltage at the terminals of resistor 34 is transmitted to the emitter of transistor 26 via capacitor 35 and determines, in the emitter space of the collector of this transistor 26, a variable current $i_m$ which is added to the direct current $i_o$. Finally, a variable current $I_m$ which is added to the direct current $I_o$ is produced in the collector of the transistor 30. In the sum current $I_o+I_m$ formed in this way the variable current $I_m$ corresponds to the voice signal.

This sum current $I_o+I_m$ is used in the second portion 9-2 of the modulator to charge the capacitor 40 via the diode 41, a direct discharging current $I_d$ of this capacitor being produced permanently at the collector of npn transistor 42, whose base is polarised by means of the bridge formed by resistors 43, 44 and diode 45. So the charging current of the capacitor 40 is finally $I_c=I_o+I_m-I_d$ and this charging current is produced during the duration of the positive pulses of the signal P which is applied, via terminal 46 of the modulator, to the cascade arrangement of two npn transistors 47 and 48, to which the usual resistors 49, 50 and 51 are associated. It can be easily seen that during the duration of the positive pulses of the signal P transistor 47 is saturated, transistor 48 is non-conducting and capacitor 40 is charged by the current $I_c=I_o+I_m-I_d$. In the intervals between the positive pulses of the signal P transistor 47 is non-conducting, transistor 48 is saturated and capacitor 40 is discharged by the direct current $I_d$. Finally, the capacitor can be discharged suddenly and completely during the duration of the positive pulses of the signal P which are applied via the terminal 52 and the resistor 53 to the base of the npn transistor 54 to saturate this transistor 54.

Figure 3:
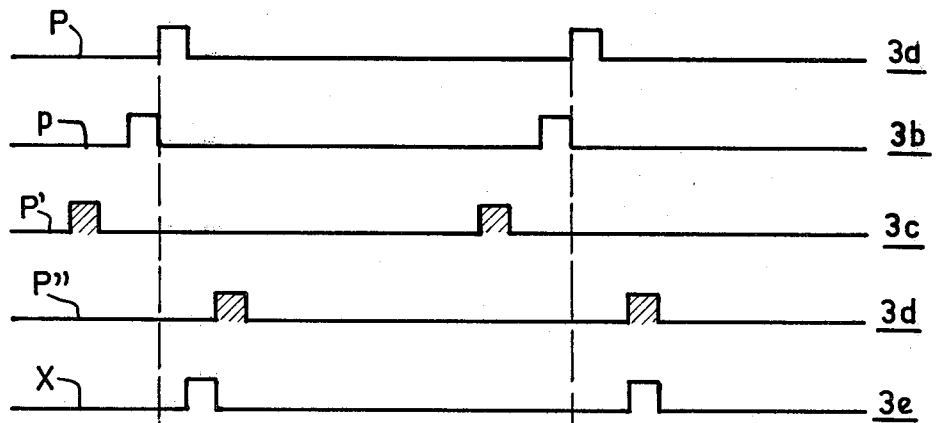
FIG. 3 shows diagrams of several signals which are intended to explain the operation of the pulse-duration modulator.
Figure 3:
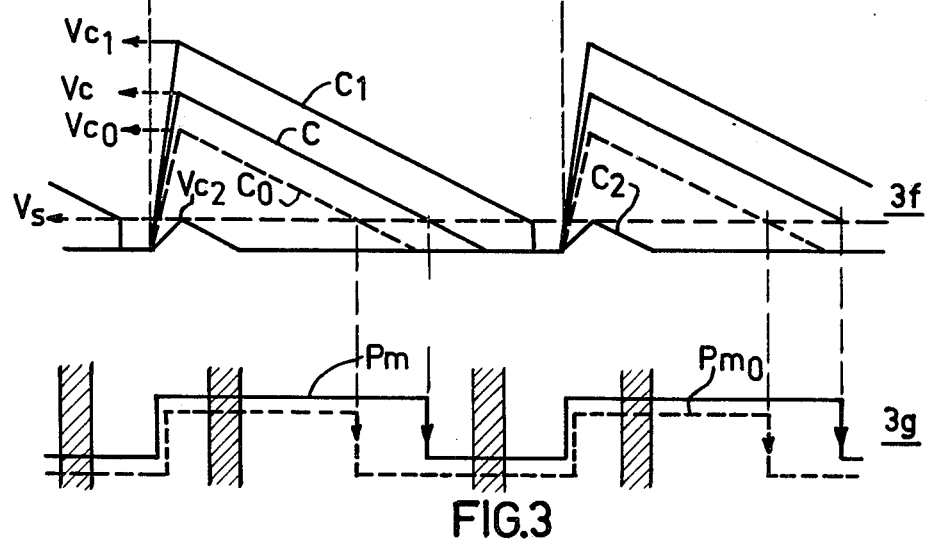

The control signals P and p are generated in the control signal generator 11. Diagram 3a of FIG. 3 shows shape of the signal P. The curves $C_o$, C, $C_1$, $C_2$ of diagram 3f show for several cases the voltage which is produced at the terminals of the capacitor 40. The broken-line curve $C_o$ corresponds to the case where the variable current $I_m$, which is representative of the voice signal is zero; the capacitor 40 is then charged by the quiescent current $I_{co}=I_o-I_d$ and at the end of each pulse of the signal P it acquires the voltage $V_{co}$, which is proportional to $I_{co}$; between these pulses this capacitor is discharged completely by the direct current $I_d$. The curve C corresponds to the case where during the duration of one pulse of the signal P the variable current $I_m$ has a positive amplitude in the normal operating range of the modulator. Assuming this pulse duration to be very short so that the amplitude of the current $I_m$ is substantially constant, capacitor 40 is charged by a substantially constant current $I_c=I_o-I_d+I_m$ to obtain a voltage $V_c$ at the end of each pulse of the signal P. The voltage difference $V_c-V_{co}$ is proportional to the value of the current $I_m$ during each pulse of the signal P. Between these pulses capacitor 40 is completely discharged by the direct current $I_d$. If the amplitude of the variable current $I_m$ were negative during the pulses of the signal P, the corresponding curves C would of course be wholly below curve $C_o$.

The curves $C_1$ and $C_2$ correspond to the case where during the very short duration of the pulses of the signal P the current $I_m$ reaches the extreme amplitudes of the normal operating range of the modulator, that is to say the extreme positive amplitude $I_{m1}$, and the extreme negative amplitude $-I_{m1}$. At the end of each pulse of the signal P, capacitor 40 acquires in one case the voltage $V_{c1}$ and in the other case the voltage $V_{c2}$. Between these pulses the capacitor is discharged by the direct current $I_d$. It is easy to see that for the case of high positive amplitudes of the current $I_m$, as is the case for the current $I_{m1}$ which corresponds to the curve $C_1$, there is a risk that the capacitor has not yet been fully discharged by the currennt $I_d$ at the moment the pulses of the signal P appear. For this reason capacitor 40 is discharged suddenly by the pulses of the signal P shown in diagram 3b, these pulses being produced just before those of the signal P. This sudden discharge is actually produced in the case of curve $C_1$. The modulated pulses are formed from the voltage at the terminals of capacitor 40, as will be explained below.

The circuit diagram of FIG. 2 shows that the voltage at capacitor 40 is reproduced on the emitter of the npn transistor 52 by means of the composite transistor which is formed by pnp transistors 53 and the pnp transistor 54 connected thereto and with diode 55 and resistor 56 as shown in the Figure. This voltage at the emitter of transistor 52 is applied to the voltage divider bridge formed by the resistors 57 and 58. The tap of this bridge is connected to base of the npn transistor 59 and the ratio of resistors 57 and 58 is chosen so that transistor 59 is rendered conductive when the voltage at the terminals of capacitor 40 is higher than a predetermined threshold voltage $V_S$ and is rendered non-conductive in the opposite case. The collector of transistor 59 is provided with a resistor 60 and is connected to the base of npn transistor 61, which operates in a manner which is exactly the opposite of that of transistor 59. Consequently, as shown by diagram 3g, a modulated signal $P_m$ which is represented by the solid curve and is positive when the voltage of the capacitor 40 represented by curve C in diagram 3f is higher than the threshold voltage $V_s$ and is zero in the opposite case, is obtained at the collector of the transistor 61, which is provided with a resistor 62 and is connected to the output terminal 63 of the modulator 9. For case in which the voltage of capacitor 40 is as illustrated by curve $C_o$ (variable current $I_m=0$) the signal obtained at the output 63 of the modulator has the shape illustrated by the broken-line curve $P_{mo}$.

It is clear that the position of the descending edge of the signal $P_m$ with respect to the ascending edge of the curve $P_{mo}$ indicates the sign and the amplitude of variable current $I_m$ during the short duration of the pulses of the control signal P. Advantageously, the threshold voltage $V_S$ is precisely equal to the voltage $V_{C2}$ which is obtained at the capacitor 40 at the end of a pulse of the signal P for the extreme negative value $-I_{m1}$ of the variable current $I_m$. It is also advantageous when for the extreme positive value $I_{m1}$ of the variable current $I_m$ the decreasing voltage across the capacitor 40 reaches the threshold voltage $V_S$ exactly at the instant at which a pulse of the signal P starts, which resets the voltage of capacitor 40 to zero. These conditions are considered to have been realized in the trajectory of the curves $C_1$ and $C_2$ in diagram 3f and it is therefore clear that for the overall range of the values of the variable current $I_m$, between $-I_{m1}$ and $I_{m1}$, the descending edge of the signal $P_m$, which is in a linear relationship with the variable current $I_m$, moves as far as possible between the end of one pulse of the signal P and the beginning of a pulse of the signal p. It should be noted here, that the ascending edge of the pulses of the signal $P_m$ shifts somewhat (within a pulse of the signal P) when the variable current $I_m$ covers its range from $-I_{m1}$ to $+I_{m1}$. This results in a parasitic modulation of the duration of the pulses of the signal $P_m$, which is of no importance for the level control arrangement in which only the descending edge of the pulses of the signal $P_m$ is used to detect an overshoot of the amplitude of the variable current $I_m$.

The modulated signal $P_m$ which is available at the terminal 63 of the modulator 9 is applied to the level overshoot detection circuit 10, which has for its function to produce at its output 64 a compression signal $P_c$ in which a compression pulse appears each time it is detected that the positive or the negative amplitude of the variable current $I_m$ reaches or exceeds the absolute value of a predetermined threshold. This detection is based on the position of the descending edge of the modulated signal $P_m$. To obtain this, two pulse signals P' and P", shown in diagrams 3c and 3d are used. The pulses of the signals P' and P" are situated in the hatched zones of diagram 3g, that is to say towards the two ends of the range in which the descending edge of the modulated signal $P_m$ can shift. The overshoot detection arrangement 10 produces a compression pulse when this descending edge reaches or exceeds the position of the pulses P' or P".

Figure 4:
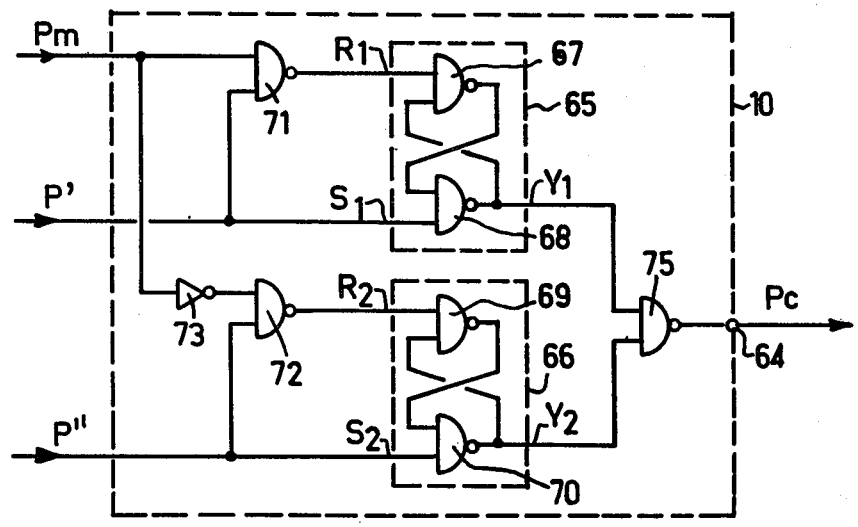
FIG. 4 is a circuit diagram of the overshoot detector.

In the embodiment shown in FIG. 4 this overshoot detection circuit 10 comprises two bistable trigger circuits 65 and 66 of the RS type which are formed in usual manner by means of the NAND-gates 67, 68 and 69, 70. The NAND-gate 71, which receives the signals $P_m$ and P' is connected to the input $R_1$ of the bistable trigger circuit 65; the signal P' is applied to the input $S_1$ of this bistable trigger circuit 65. Connected to the input $R_2$ of the bistable trigger circuit 66 is the output of the NAND-gate 72 which receives the signal P" and the signal $\overline{P_m}$, which is complementary to $P_m$ and is formed by means of the inverting circuit 73; the signal P" is applied to the input $S_2$ of this bistable trigger circuit 66. The outputs $Y_1$ and $Y_2$ of the two bistable trigger circuits are connected to two inputs of the NAND-gate 75, the output of which is connected to the output 64 of the overshoot detection circuit 10 to produce the compression signal $P_c$.

Figure 5:
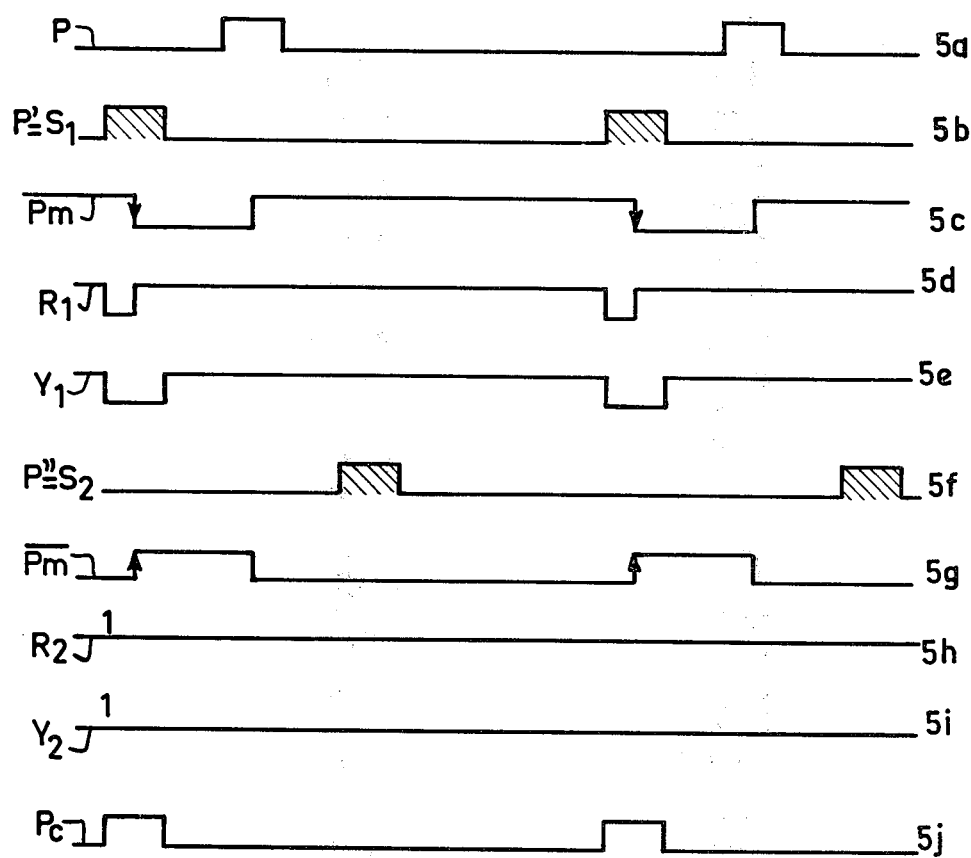
FIGS. 5 and 6 show diagrams of several signals intended to explain the operation of the overshoot detector for two cases in which the amplitude has been exceeded.
Figure 6:
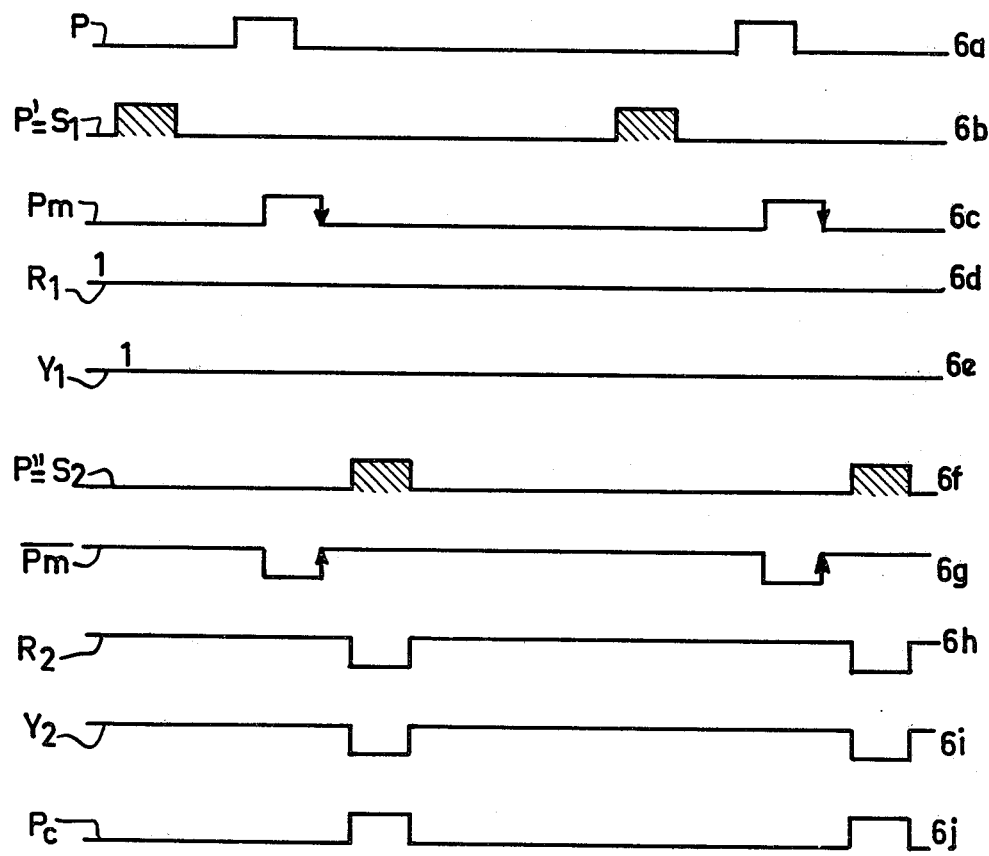

The operation of the circuit 10 is illustrated by the diagrams of FIGS. 5 and 6. FIG. 5 refers to the case in which the descending edges of the modulated signal $P_m$ are produced during the pulses of the signal P'. Diagram 5a shows the signal P. Diagram 5b shows the signal P', which is the same as the signal appearing at the input $S_1$ of the bistable trigger circuit 65. Diagram 5c shows the modulated signal $P_m$, the descending edges of which provided with an arrow are produced during the hatched pulses of the signal P'. Diagram 5d shows the resulting signal at the input $R_1$ of the bistable trigger circuit 65. The signal $Y_1$, which is shown in diagram 5e, is derived from the output of this bistable trigger circit. This signal $Y_1$ is complementary to the signal P'. Diagram 5f shows the signal P" which comprises the pulses which are represented by the hatched zones and this signal is the same as that appearing at the input $S_2$ of the bistable trigger circuit 66. Diagram 5g shows the signal $\overline{P_m}$ the ascending edges of which, are indicated by an arrow, coincide with the descending edges of the modulated signal $P_m$. Diagram 5h shows the resultant signal at the input $R_2$ of the bistable trigger circuit 66, this signal being equal to "1". The signal $Y_2$ is derived therefrom at the output of the bistable trigger circuit 66, which is shown in diagram 5i and which is equal to "1". Finally, the compression signal $P_c$ supplied by the NAND-gate 75 is of the shape shown in diagram 5j and it can be seen that each time a descending edge of the signal $P_m$ is produced during a pulse of the signal P' a compression pulse which coincides with the pulse of the signal P' appears in the signal $P_c$.

FIG. 6 relates to the case in which the descending edges of the modulated signal $P_m$ are produced before the pulses of the signal P". Diagrams 6a to 6j show the same signals as diagrams 5a to 5j, respectively, it being possible for these signals to have different shapes in the corresponding diagrams. FIG. 6c shows that the descending edges of the modulated signal $P_m$ are produced before the pulses of the signal P''. The signal at the input $R_1$ of the bistable trigger circuit 65, which signal is shown in diagram 6d, remains equal to "1". The signal $Y_1$ at the output of this bistable trigger circuit, which signal is shown in diagram 6e, remains equal to "1". Starting from the shapes of the signals P''=$S_2$, $\overline{P_m}$ and $R_2$ shown in the diagrams 6f, 6g, 6h it can be easily derived that the signal $Y_2$ produced by the bistable trigger circuit 66 has the shappe shown in diagram 6i. The result is that the compression signal $P_c$ supplied by the overshoot detection circuit 10 has the shape shown in diagram 6j. This diagram shows that each time a descending edge of the modulated signal $P_1$ is produced before a pulse of the signal P'', there appears in the signal $P_c$ a compression pulse which coincides with the pulse of the signal P''.

In circuit 8, the compression signal $P_c$ is applied to the base of the npn transistor 76, which has been provided with a base resistor 77 and with series-arranged collector resistors 78 and 79. The pnp transistor 80 has its base connected to a junction of resistors 78 and 79 and is provided with an emitter resistor 81 and has its collector connected to capacitor 82. Each compression pulse of signal $P_c$ which indicates that the amplitude of the variable current $I_m$ corresponding to the voice signal is exceeded is used to charge capacitor 82. The voltage at the capacitor 82 is used to control current in npn transistor 83, the emitter current of which is applied to the base of npn transistor 84 via resistor 85. Transistor 84 is more conductive as capacitor 82 is charged and has, consequently, an impedance which is weaker and weaker for the received voice signal coming from the input terminal 88 of the attenuating circuit and applied to its collector via resistor 86 and coupling capacitor 87. The voice signal, which is available between resistor 86 and capacitor 87 is therefore corrected by means of attenuation when circuit 10 detects that the amplitude is exceeded. This is the signal which is applied to the input 32 of the pulse-duration modulator.

It should be noted that capacitor 82 is charged during the compression pulses by a comparatively high current, the collector current of transistor 80, and that this capacitor is discharged by a weak current, the base current of transistor 83, which may advantageously be a composite transistor. This results in that the voltage at capacitor 82 rapidly follows exceeding of the voice signal amplitude during the attack of the syllables and follows the amplitude decreases with a certain delay. Finally, the voltage at the terminals of the capacitor 82 stabilize around a mean value which determines a substantially constant level of the voice signal.

The generator 11 producing control signals P, P', P'', P can be easily designed by one having normal skill in the art and it is not necessary to describe this generator in detail. As indicated in the foregoing it is a requirement that the signal P be formed from pulses having a short duration; its frequency must be comparatively high with respect to the maximum frequency of the voice signal. The frequency of the pulses of the signal P may, for example, be 20 kHz and the duration of each pulse may be equal to 1/20 of a 20 kHz period. In the other signals P, P', P'' the pulses have the same frequency and the same duration and are shifted relative to the signal P, as shown in FIG. 3.

Figure 7:
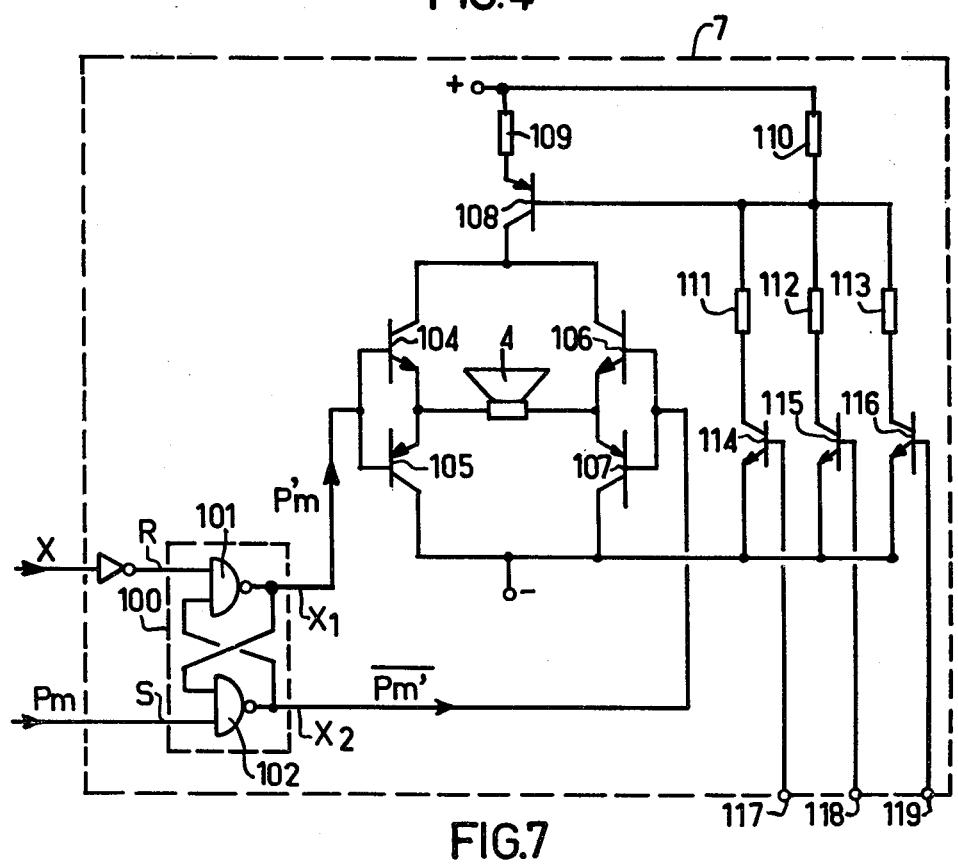
FIG. 7 is a circuit diagram of an embodiment of the loudspeaker amplifier intended to be associated with the arrangement of the invention.

To energise the loudspeaker 4 it is advantageous to use the modulated signal $P_m$, which results in a loudspeaker amplifier 7, which can be realized in a very simple manner, as shown in FIG. 7. In this amplifier the modulated signal $P_m$ is first processed to eliminate the parasitic modulation which, as mentioned in the foregoing, is due to the fact that the leading edge of the signal $P_m$ does not have a position which is absolutely fixed. To eliminate this prasitic modulation two NAND-gates 101 and 102 are used, which are combined to form a bistable trigger circuit 100 of the RS-type. The signal $P_m$ is applied to the input S of this bistable trigger circuit and the signal X, which results from the inversion of a control signal X in the inverter amplifier 103 is applied to its input R. The control signal X is supplied by the command signal generator 11 and has the same shape and the same frequency as the further control signals P, P', P'', p. Diagram 3e shows that the pulses of the signal X are produced just after the pulses of the signal P. The two complementary signals $P'_m$ and $\overline{P'_m}$ are obtained at the outputs $X_1$ and $X_2$ of the bistable trigger circuit 100. It is not difficult to verify that the parasitic modulation which which the signal $P_m$ is affected has been suppressed in the signal $P'_m$. The signal $P'_m$ is therefore a signal whose pulses are duration-modulated by the voice signal in accordance with a linear law in the normal operating range of the modulator.

The two signals $P'_m$ and $\overline{P'_m}$ are applied to the interconnected bases of complementary transistors 104, 105 and to the interconnected bases of two further complementary transistors 106, 107, respectively. The collectors of transistors 105, 107 are combined at the negative supply terminal and the collectors of transistors 104, 106 are combined at the positive supply terminal across the emitter-collector space of pnp transistor 108, which has been provided with an emitter resistor 109. The two terminals of the loudspeaker 4 are connected to the respective emitters of transistors 104, 105 and to the emitters of transistors 106, 107. Arranged in this way the four transistors 104 to 107 form a dual symmetrical amplifier follower whose load is constituted by the loudspeaker 4. This loudspeaker acts as a low-pass filter and is substantially insensitive to the modulation contained in the signal $P'_m$, that is to say to the voice signal, and is insensitive to the high-frequency components (20 kHz and its harmonics), contained in the signal $P'_m$.

The sound level from the loudspeaker 4 can be controlled by limiting the current which flows through transistor 108 to feed the loudspeaker via transistors 104 to 107. This current can be limited to controllable values by having the polarising voltage for the base of transistor 108 vary. To this end a fixed resistor 110 is connected between the base and the positive supply terminal of transistor 108 and between this base and the negative supply terminal there are connected the resistors 111, 112, 113, each in series with the emitter-collector spaces of npn transistors 114, 115, 116. The voltages at the bases of the transistors 114, 115, 116 can be controlled by the user by means of push-buttons which must be connected to the terminals 117, 118, 119 and which must be kept depressed in order to be able to establish a certain number of discrete values of the current flowing through transistor 108 and, consequently, of the sound level supplied by the loudspeaker.

What is claimed is:
1. An arrangement for the automatic control of the sound level of a telephone station comprising:
a source of received voice signal, a controllable attenuation circuit for producing a control signal for said received voice signal, a pulse-duration modulator producing a signal which is formed from pulses the duration of which has been modulated by said voice signal supplied by said controllable attenuation circuit, an overshoot detector which generates from the signal supplied from said modulator a compression pulse each time it is detected that the amplitude of the modulated voice signal reaches a certain threshold, and said attenuation circuit comprising an integrating circuit, said compression pulse being applied to said attenuation circuit for controlling the charging of said integrating circuit which produces the attenuation control signal.

2. A control arrangement as claimed in claim 1, wherein said pulse-duration modulator comprises means for charging a capacitor by a current obtained from the sum of a direct current and a variable current corresponding to the attenuated voice signal, during pulses which are of a short duration and have a high frequency with respect to that of the voice signal, means for discharging said capacitor by a direct current during the interval between the said pulses of a short duration, the duration-modulated pulses being formed by comparing the voltage at the terminal of said capacitor with a threshold voltage, said overshoot detection circuit supplying a compression pulse each time an edge which is characteristic of said duration-modulated pulses reaches either the one or the other of two extreme positions.

3. A control arrangement as claimed in one of the claims 1 or 2, wherein said integrating circuit of the controllable attenuation circuit is formed by a capacitor which is charged, during the compression pulses, by a constant current having a low time constant compared to the elapse time of the syllables of the voice signal and which is discharged with a time constant which is high with respect to the charging time constant.

4. A telephone station provided with a level control arrangement as claimed in claim 1, comprising a pulse power amplifier and wherein said duration-modulated pulses supplied by said modulator are applied to said pulse power amplifier the output of which is connected to the loudspeaker of the telephone station.

5. A telephone station as claimed in claim 4, wherein said amplifier is provided with means to control the current supplied to the loudspeaker during the duration of the duration-modulated pulses.

* * * * *